United States Patent
Liu et al.

(10) Patent No.: US 9,978,637 B2
(45) Date of Patent: May 22, 2018

(54) MECHANISM FOR FORMING PATTERNED METAL PAD CONNECTED TO MULTIPLE THROUGH SILICON VIAS (TSVS)

(71) Applicant: Taiwan Semiconductor Manufacturing Company, Ltd., Hsin-Chu (TW)

(72) Inventors: Tzuan-Horng Liu, Longtan Township (TW); Shih-Wen Huang, Shuishang Township (TW); Chung-Yu Lu, Hsin-Chu (TW); Hsien-Pin Hu, Zhubei (TW); Shang-Yun Hou, Jubei (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 432 days.

(21) Appl. No.: 14/052,365

(22) Filed: Oct. 11, 2013

(65) Prior Publication Data
US 2015/0102482 A1   Apr. 16, 2015

(51) Int. Cl.
*H01L 29/40* (2006.01)
*H01L 23/488* (2006.01)
(Continued)

(52) U.S. Cl.
CPC ...... *H01L 21/76805* (2013.01); *H01L 23/147* (2013.01); *H01L 23/481* (2013.01);
(Continued)

(58) Field of Classification Search
CPC ............. H01L 21/76805; H01L 23/147; H01L 23/481; H01L 23/49827; H01L 25/0655; H01L 21/486; H01L 23/49816; H01L 24/05; H01L 24/13; H01L 24/16; H01L 24/32; H01L 24/81; H01L 24/83;
(Continued)

(56) References Cited

U.S. PATENT DOCUMENTS 6,100,589 A * 8/2000 Tanaka ............... H01L 23/5283
                                                      257/750
6,531,384 B1   3/2003 Kobayashi et al.
(Continued)

FOREIGN PATENT DOCUMENTS

CN          1554116 A    12/2004
TW         200843061     11/2008
(Continued)

*Primary Examiner* — Marcos D Pizarro
*Assistant Examiner* — Nelson Garces
(74) *Attorney, Agent, or Firm* — Slater Matsil, LLP (57) ABSTRACT

Various embodiments of mechanisms for forming through a three-dimensional integrated circuit (3DIC) structure are provided. The 3DIC structure includes an interposer bonded to a die and a substrate. The interposer has a conductive structure with through silicon vias (TSVs) connected to a patterned metal pad and a conductive structure on opposite ends of the TSVs. The pattern metal pad is embedded with dielectric structures to reduce dishing effect and has regions over TSVs that are free of the dielectric structures. The conductive structure has 2 or more TSVs. By using a patterned metal pad and 2 or more TSVs, the reliability and yield of the conductive structure and the 3DIC structure are improved.

20 Claims, 10 Drawing Sheets

(51) Int. Cl.
*H01L 23/48* (2006.01)
*H01L 23/498* (2006.01)
*H01L 21/768* (2006.01)
*H01L 21/50* (2006.01)
*H01L 23/52* (2006.01)
*H01L 23/14* (2006.01)
*H01L 25/065* (2006.01)
*H01L 23/00* (2006.01)
*H01L 21/48* (2006.01)

(52) U.S. Cl.
CPC .... *H01L 23/49827* (2013.01); *H01L 25/0655* (2013.01); *H01L 21/486* (2013.01); *H01L 23/49816* (2013.01); *H01L 24/05* (2013.01); *H01L 24/13* (2013.01); *H01L 24/16* (2013.01); *H01L 24/32* (2013.01); *H01L 24/81* (2013.01); *H01L 24/83* (2013.01); *H01L 24/97* (2013.01); *H01L 2224/0345* (2013.01); *H01L 2224/0401* (2013.01); *H01L 2224/05166* (2013.01); *H01L 2224/05647* (2013.01); *H01L 2224/131* (2013.01); *H01L 2224/13082* (2013.01); *H01L 2224/13147* (2013.01); *H01L 2224/16227* (2013.01); *H01L 2224/32225* (2013.01); *H01L 2224/73204* (2013.01); *H01L 2224/81193* (2013.01); *H01L 2224/81815* (2013.01); *H01L 2224/831* (2013.01); *H01L 2224/97* (2013.01); *H01L 2924/1305* (2013.01); *H01L 2924/13091* (2013.01); *H01L 2924/181* (2013.01)

(58) Field of Classification Search
CPC ..... H01L 2224/0345; H01L 2224/0401; H01L 2924/81; H01L 2224/05166; H01L 2924/181; H01L 2224/05647; H01L 2224/13082; H01L 2224/131; H01L 2224/13147; H01L 2224/16227; H01L 2224/32225; H01L 2224/73204; H01L 2224/81193; H01L 2224/81815; H01L 2224/831; H01L 24/97; H01L 2924/1305; H01L 2924/13091
USPC .................................................. 257/732–742
See application file for complete search history.

(56) References Cited

U.S. PATENT DOCUMENTS

| | | | |
|---|---|---|---|
| 7,576,435 | B2 | 8/2009 | Chao |
| 8,368,220 | B2 | 2/2013 | Lu et al. |
| 8,643,148 | B2 | 2/2014 | Lin et al. |
| 2002/0117756 | A1* | 8/2002 | Yamashita ............... H01 24/03 257/758 |
| 2011/0115082 | A1* | 5/2011 | Gluschenkov ........ H01L 21/486 257/738 |
| 2011/0316147 | A1* | 12/2011 | Shih ...................... H01L 21/486 257/737 |

FOREIGN PATENT DOCUMENTS

| | | |
|---|---|---|
| TW | I315903 | 10/2009 |
| TW | 201322406 | 6/2013 |

* cited by examiner

MECHANISM FOR FORMING PATTERNED METAL PAD CONNECTED TO MULTIPLE THROUGH SILICON VIAS (TSVS)

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area and/or lower height than packages of the past, in some applications.

Three-dimensional integrated circuits (3DICs) have been created to further shrink integrated dies and packages. New packaging technologies have begun to be developed to enable 3DICs. These relatively new types of packaging technologies for semiconductors face manufacturing challenges.

BRIEF DESCRIPTION OF THE DRAWINGS

For a more complete understanding of the embodiments, and the advantages thereof, reference is now made to the following descriptions taken in conjunction with the accompanying drawings, in which:

FIG. 3A' shows a cross-sectional view of the metal pad of FIG. 3A formed over through silicon vias (TSVs).

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

Three-dimensional integrated circuits (3D ICs) have been therefore created to resolve the above-discussed limitations. In some formation processes of 3D ICs, two or more wafers, each including an integrated circuit, are formed. The wafers are sawed to form dies. Dies with different devices are packaged and are then bonded with the devices aligned. Through silicon vias (TSVs) and Through-package-vias (TPVs), also referred to as through-molding-vias (TMVs), are increasingly used as a way of implementing 3D ICs. TSVs and TPVs are often used in 3D ICs and stacked dies to provide electrical connections and/or to assist in heat dissipation.

Figure 1A:
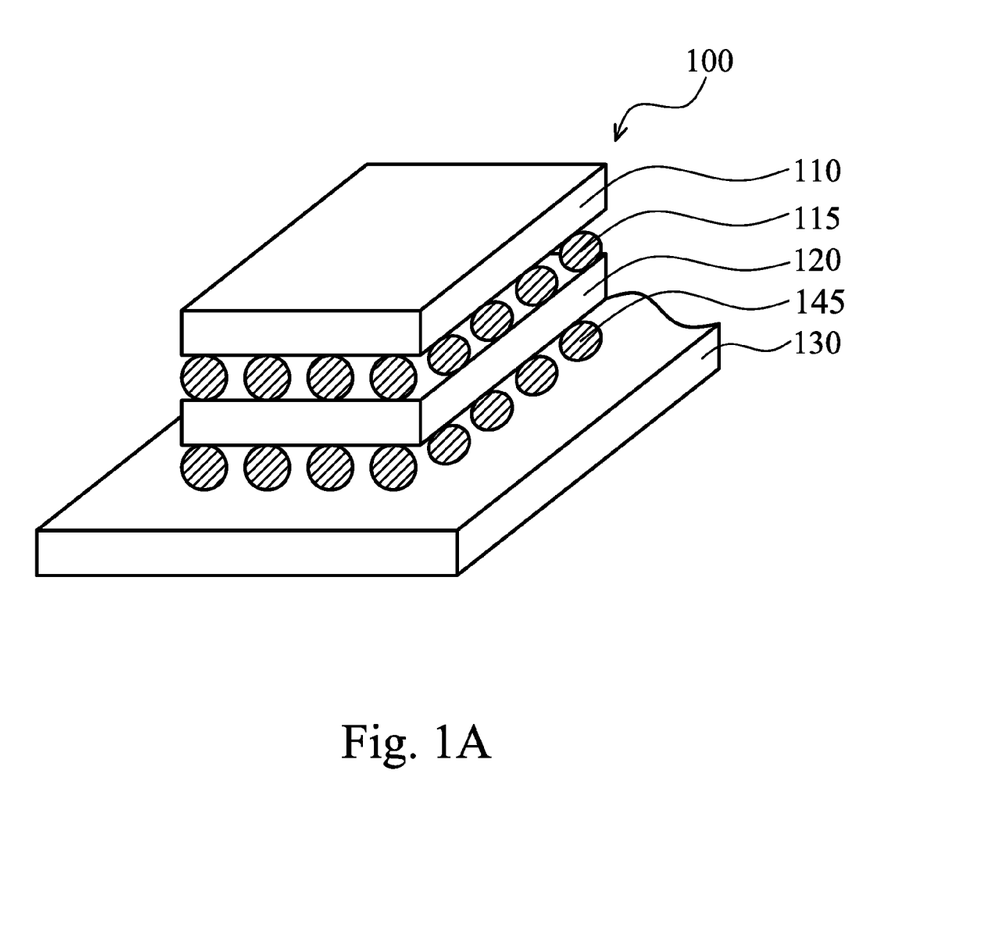
FIG. 1A is a perspective view of a package structure, in accordance with some embodiments.

FIG. 1A is a perspective view of a package structure 100 including a die 110 bonded to an interposer 120, which is further bonded to another substrate 130 in accordance with some embodiments. After die 110 is bonded to interposer 120, the packaged structure may be sawed into individual pieces and interposer 120 would appear to be a semiconductor die. Each of die 110 and interposer 120 includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-onchip (SoC) device, combinations thereof, and other suitable types of devices. Interposer 120 includes through silicon vias (TSVs) or through-package-vias (TPVs), and function as an interposer, in accordance with some embodiments. In some embodiments, interposer 120 does not include active devices.

Substrate 130 may be made of bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals. In some embodiments, substrate 130 is a multiple-layer circuit board. Substrate 130 includes interconnect structures, in some embodiments.

Die 110 is bonded to interposer 120 via connectors (or bonding structures) 115, and interposer 120 is bonded to substrate 130 via connectors 145. If two or more dies, such as die 110 and other die(s), with different sizes of connectors are bonded to interposer 120, the packaging mechanisms could be challenging. TSVs in interposer 120 assist electrical connection and heat dissipation.

Figure 1B:
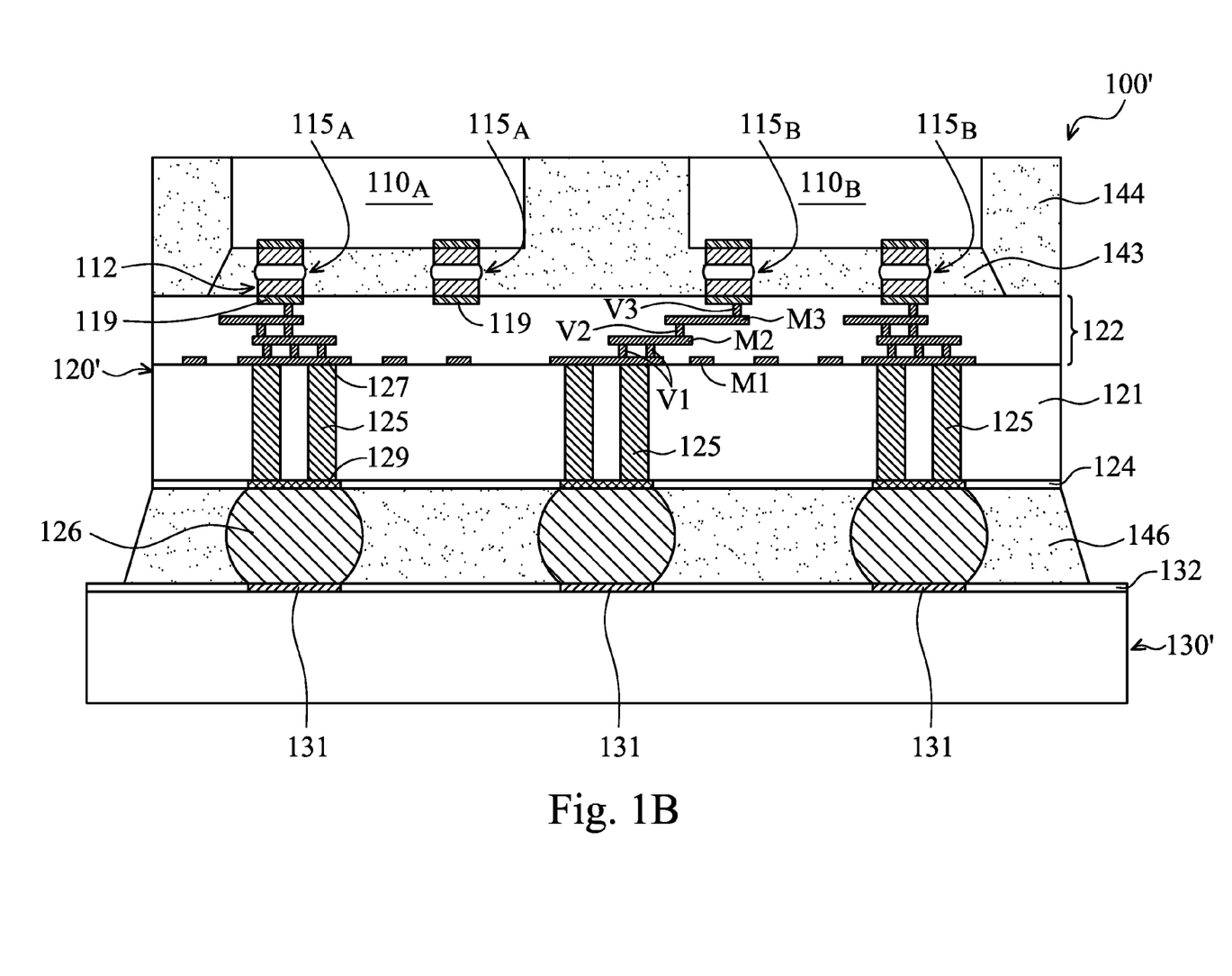
FIG. 1B show a cross-sectional view of a three-dimensional integrated circuit (3DIC) structure, in accordance with some embodiments.
Figure 1C:
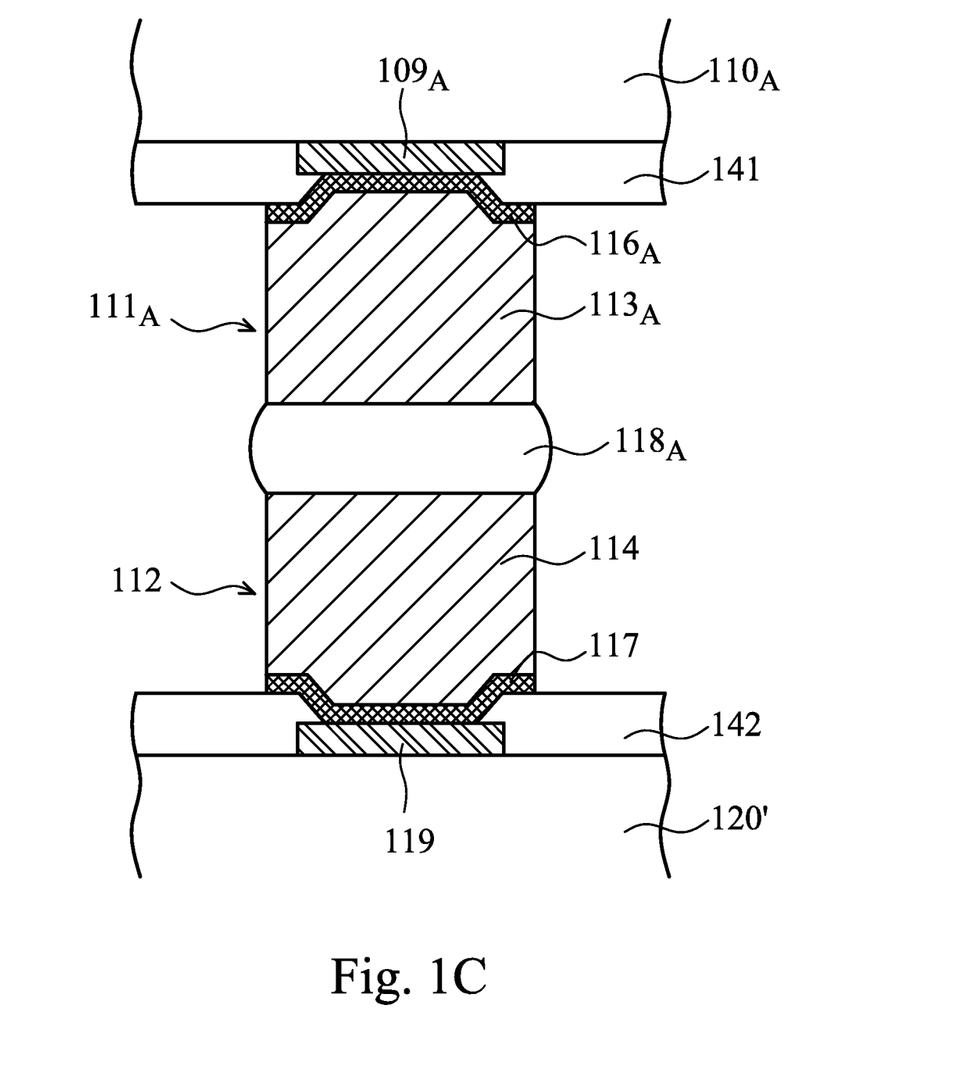
FIG. 1C shows a connector (or bonding structure) between a die and an interposer, in accordance with some embodiments.

FIG. 1B shows a cross-sectional view of a die package 100', in accordance with some embodiments. Die package 100' includes a die $110_A$ and a die $110_B$. For example, die $110_A$ could be a central processing unit (CPU) or graphic control unit (GPU), and die $110_B$ could be a memory device, such as static random-access memory (SRAM) dynamic random-access memory (DRAM), or other types of memory devices. Dies $110_A$ and $110_B$ are connected to a substrate (or interposer) 120' via connectors $115_A$ and $115_B$ respectively. Connectors $115_A$ and $115_B$ are bonding structures formed by bonding the external connectors for dies $110_A$ and $110_B$ with external connectors of interposer 120'. In some embodiments, connectors (or bonding structures) $115_A$ and $115_B$ are formed by bonding micro-bumps (or μ-bumps) on dies $110_A$ and $110_B$ with μ-bumps 112 on interposer 120'. FIG. 1C shows a μ-bumps $111_A$ on die 110A bonded to a μ-bump 112 of interposer 120' to form a connector (or bonding structure) $115_A$, in accordance with some embodiments. μ-bumps $111_A$ includes a copper post $113_A$, an under-bump metallurgy (UBM) layer $116_A$, and a solder layer, which bonds with a solder layer of μ-bump 112 to form solder layer $118_A$. μ-bump 112 also includes a copper post 114, and an UBM layer 117. μ-bumps $111_A$ is formed over a metal pad $109_A$ and μ-bump 112 is formed over a metal pad 119.

In some embodiments, the UBM layer $116_A$ and 117 include a diffusion barrier layer formed of Ti and a seed layer formed of Cu. In some embodiments, both the diffusion barrier layer, such as a Ti layer, and the seed layer, such as a Cu layer, are deposited by physical vapor deposition (PVD) (or sputtering) methods. The solder layers from connected μ-bump bond to form a solder layer, such as solder layer $118_A$, after a reflow process. A portion of μ-bump $111_A$ rests on a passivation layer 141 and a portion of μ-bump 112 rests on a passivation layer 142. Passivation layers 141 and 142 are made of dielectric and yielding material(s), which provide insulation and absorb bonding stress. In some embodiments, passivation layers 141 and 142 are made of polymers, such as polyimide, polybenzoxazole (PBO)), or a solder resist.

Examples of bonding structures, and methods of forming them are described in U.S. application Ser. No. 13/427,753, entitled "Bump Structures for Multi-Chip Packaging," filed on Mar. 22, 2012, U.S. application Ser. No. 13/338,820, entitled "Packaged Semiconductor Device and Method of Packaging the Semiconductor Device," filed on Dec. 28, 2011, and U.S. application Ser. No. 13/667,306, entitled "Bonded Structures for Package and Substrate," filed on Nov. 2, 2012. The above-mentioned applications are incorporated herein by reference in their entireties.

FIG. 1B shows that interposer 120' includes a silicon substrate 121 with TSVs 125. Interposer 120' includes an interconnect structure 122 on one side of the silicon substrate 121 and bumps 126 on the opposite side of the interconnect structure 122. Bumps 126 are similar to connectors 145 in FIG. 1A. Interconnect structures 122 connect TSVs 125 to external connectors, μ-bumps 112. Interconnect structures 122 include conductive interconnect structures, such as metal pads, metal lines and vias. The conductive interconnect structures are insulated by dielectric layers. For example, the conductive interconnect structures include metal lines, such as M1, M2 and M3, and vias, such as V1, V2, and V3. The conductive interconnect structures also include metal pads, such as metal pads 127 and 119. In some embodiments, metal pads 127 are formed at M1 level. Metal pads 127 are connected to TSVs 125 and metal pads 119 are connected to μ-bumps 112. TSVs 125 are connected to respective UBM structures (a conductive structure) 129, which connect with bumps 126. In some embodiments, bumps 126 are C4 bumps, which are made of solder. The UBM structure 129 is made of conductive material. The conductive material may be formed by a physical vapor deposition (PVD) process, an atomic layer deposition (ALD) process, a chemical vapor deposition (CVD) process, an electro-chemical plating process, or a combination thereof. Examples of conductive material include, but are not limited to, titanium, nickel, copper, tungsten, aluminum, silver, gold, or a combination thereof. In some embodiments, the UBM structure is made of Ti. UBM structures 129 are separated from each other by a passivation layer 124. In some embodiments, passivation layer 124 is made of polymers, such as polyimide, polybenzoxazole (PBO), or a solder resist. Passivation layer 124 is made of a yielding material to protect interposer 120' and bump 126' from bonding stress.

Interposer 120' is connected to substrate 130' via bumps 126. Each bump 126 is connected to UBM structure 129 on interposer 120' and to a metal pad 131 on substrate 130'. Metal pads 131 are separated from each other by a passivation layer 132. Passivation layer 132 is made of polymers, such as polyimide, polybenzoxazole (PBO), or a solder resist. Passivation layer 132 is made of a yielding material to protect interposer 120' and substrate 130' from bonding stress resulting from the bonding process.

FIG. 1B shows at least 2 TSVs 125 are connected to a metal pad 127 on interposer 120' and to an UBM structure 129. Two or more TSVs 125 connecting to a metal pad 127 on interposer 120' and to an UBM structure 129 are more desirable than one TSV 125 because they improve the yield in the event there are issues with one of the connecting TSVs 125. For example, TSVs 125 could have poor contact with metal pad 127 or UBM structure 129. Having two or more TSVs to connect with metal pad 127 and UBM structure 129 improves fault tolerance and yield.

FIG. 1B also shows that an underfill 143 is formed between dies $110_A$, $110_B$, and interposer 120'. An underfill 146 is also formed between interposer 120' and substrate 130'. Underfill 143 protects connectors (or bonding structures) 115A and 115B. Similarly, underfill 146 protects the bumps 126. FIGS. 1B also shows that a molding compound 144 is formed to surround, cover, and protect dies $110_A$, $110_B$, and interposer 120'.

Figure 2A:
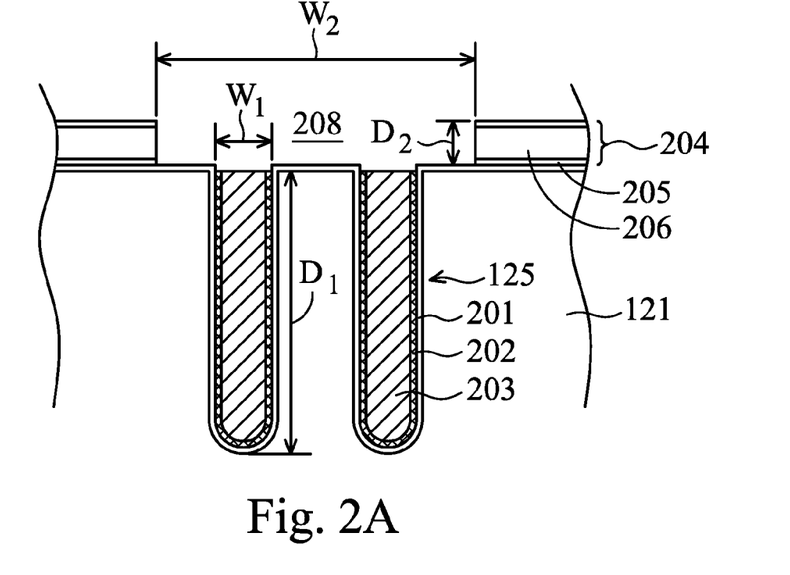
FIGS. 2A-2D show cross-sectional views of a sequential process of forming a metal pad over through silicon vias (TSVs), in accordance with some embodiments.

As mentioned above, TSVs 125 are connected to metal pads 127. Metal pads 127 are formed over TSVs 125 after TSVs 125 are formed in substrate 121. FIGS. 2A-2D show cross-sectional views of a sequential process of forming a metal pad 127 over TSVs 125, in accordance with some embodiments. FIG. 2A shows TSVs 125 formed in substrate 121. The formation of TSVs 125 involves forming deep trenches. The widths $W_1$ of the trenches for TSVs 125 are in a range from about 5 µm to about 15 µm some embodiments. The depths $D_1$ of the trenches for TSVs 125 are in a range from about 40 µm to about 120 µm some embodiments. A dielectric liner layer 201 is used to line the walls of the trenches and also the surface of substrate 121, as shown in FIG. 2A. The dielectric liner layer 201 is made of silicon oxide, in some embodiments. In some embodiments, the thickness of the dielectric liner layer 201 is in a range from about 0.3 µm to about 1.5 µm some embodiments.

A barrier layer 202 is then deposited over the dielectric liner layer 201. The barrier layer 202 may be made of Ti, Ta, TiN, TaN, or a combination thereof. In some embodiments, the thickness of the barrier layer 202 is in a range from about 0.05 µm to about 0.5 µm some embodiments. The remaining portions of the trenches are filled with a conductive layer 203, which is made of a conductive material with low-resistivity, such as Cu, Cu alloy, Al, Al alloy, or other applicable material(s). In some embodiments, the thickness of the conductive layer 203 (measured on the substrate surface) is in a range from about 4 µm to about 14 µm some embodiments. The excess conductive layers 203 and 202 outside of the trenches are then removed, such as by a chemical-mechanical polishing (CMP) process. The TSVs 125 are formed as shown in FIG. 2A.

After TSVs 125 are formed, a dielectric stack 204 is formed over exposed dielectric liner layer 201 and the top surfaces of TSVs 125. In some embodiments, the dielectric stack 204 includes an etch stop layer 205, and an inter-level dielectric (ILD) layer 206. In some embodiments, the etch stop layer 205 is made of SiC, SiN or SiON. The etch stop layer 205 has a thickness in a range from about 200 nm to about 800 nm, in some embodiments. The ILD layer 206 may be made of silicon oxide, or dielectric material with low dielectric constant (low-k). The ILD layer 206 could be doped. In some embodiments, the k value of the ILD layer 206 is less than 3.5. In some embodiments, the k value of the ILD layer 206 is less than 2.5. The ILD layer 206 has a thickness in a range from about 700 nm to about 1000 nm, in some embodiments.

After the dielectric stack 204 is formed, the dielectric stack 204 is patterned to form an opening 208 for metal pad 127. The patterning process involves applying a photoresist layer over substrate 201, a lithography process, and an etching process. FIG. 2A shows the dielectric stack 204 after it is patterned. In some embodiments, the opening 208 has a width $W_2$ in a range from about 10 µm to about 50 µm some embodiments. The height $D_2$ of the dielectric stack 204 is in a range from about 100 nm to about 3000 nm, in some embodiments.

Figure 2B:
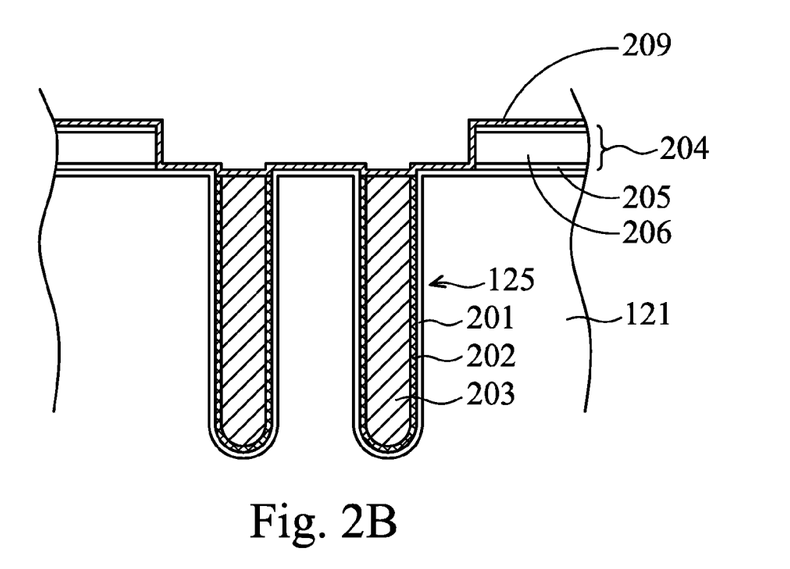

After the dielectric stack 204 is patterned, a barrier-seed layer 209 is formed to cover the surface of the dielectric stack 204 and also to line opening 208, as shown in FIG. 2B in accordance with some embodiments. In some embodiments, the barrier-seed layer 209 includes a barrier sub-layer and a plating seed sub-layer. The barrier sub-layer is used to prevent copper diffusion and the seed sub-layer is used to enable subsequent copper plating. In some embodiments, the barrier sub-layer is made of Ti, TiN, Ta, TaN, or a combination thereof. In some embodiments, the barrier sub-layer has a thickness in a range from about 10 nm to about 100 nm. In some embodiments, the plating seed sub-layer is made of Cu or Cu alloy. In some embodiments, the plating seed sub-layer has a thickness in a range from about 100 nm to about 500 nm. In some embodiments, each of the barrier sub-layer and plating seed layer is formed by physical vapor deposition (PVD) process, atomic layer deposition (ALD) process, and other applicable processes.

Figure 2C:
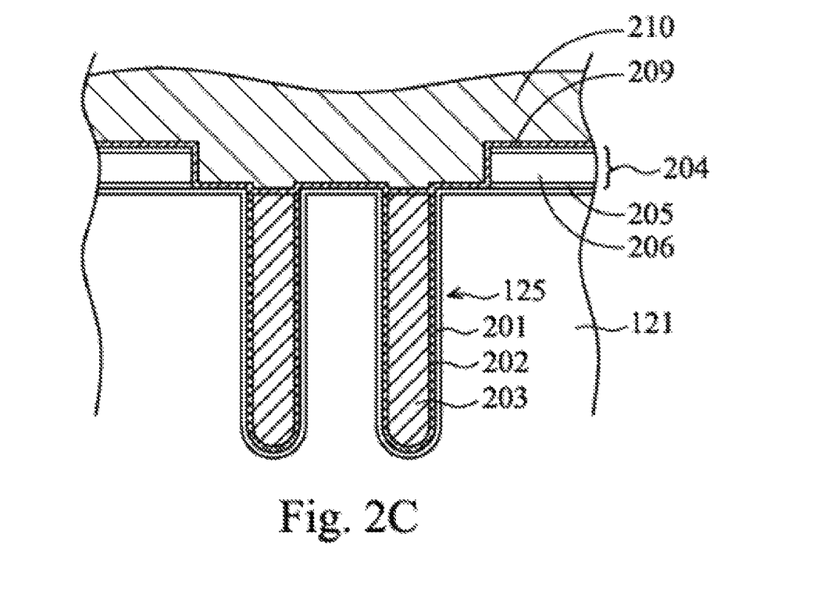
Figure 2D:
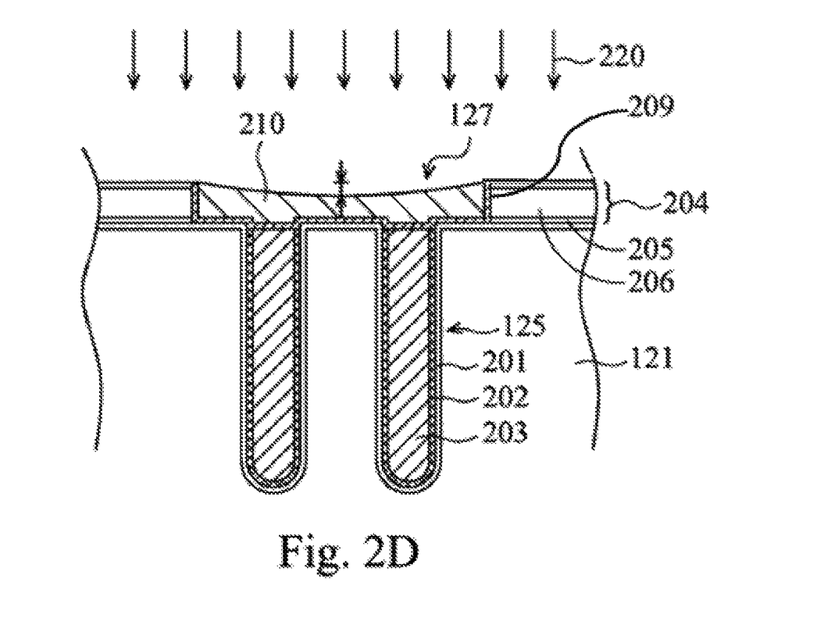

After the barrier-seed layer 209 is formed, a copper layer 210 is deposited over the barrier-seed layer 209 and fills the remaining portion of opening 208, as shown in FIG. 2C. The copper layer 210 is formed by a plating process, in some embodiments. The copper layer 210 also deposits outside opening 208. Copper layer 210 needs to be removed. In some embodiments, the excess copper layer 210 and barrier-seed layer 209 outside opening 208 are removed by a chemical-mechanical polishing (CMP) process 220, as shown in FIG. 2D. After the excess copper layer 210 and barrier-seed layer 209 outside opening 208 are removed, metal pad 127 is formed.

As mentioned above, the width $W_2$ of opening 208 is in a range from about 10 µm to about 50 µm some embodiments. The width $W_2$ of opening 208 is the width of metal pad 127. Due to the width of metal pad 127, the CMP process 220 could cause dishing of the metal pad 127, as shown in FIG. 2D. FIG. 2D shows that center of metal pad 127 is lower than edges of metal pad 127 due to CMP dishing effect. The dishing of metal pad 127 could result in metal stringers between vias formed over metal pad 127, which could result in shorting and/or reliability issues lowering the yield.

After the metal pad 127 is formed, additional processing is performed to complete the formation of interconnect structure 122 and bump structures, such as µ-bumps 112, described above. The back side of substrate 121 is then grounded to expose TSVs 125. Afterwards, the conductive structures 129 and passivation layer 124 are formed.

Figure 3A:
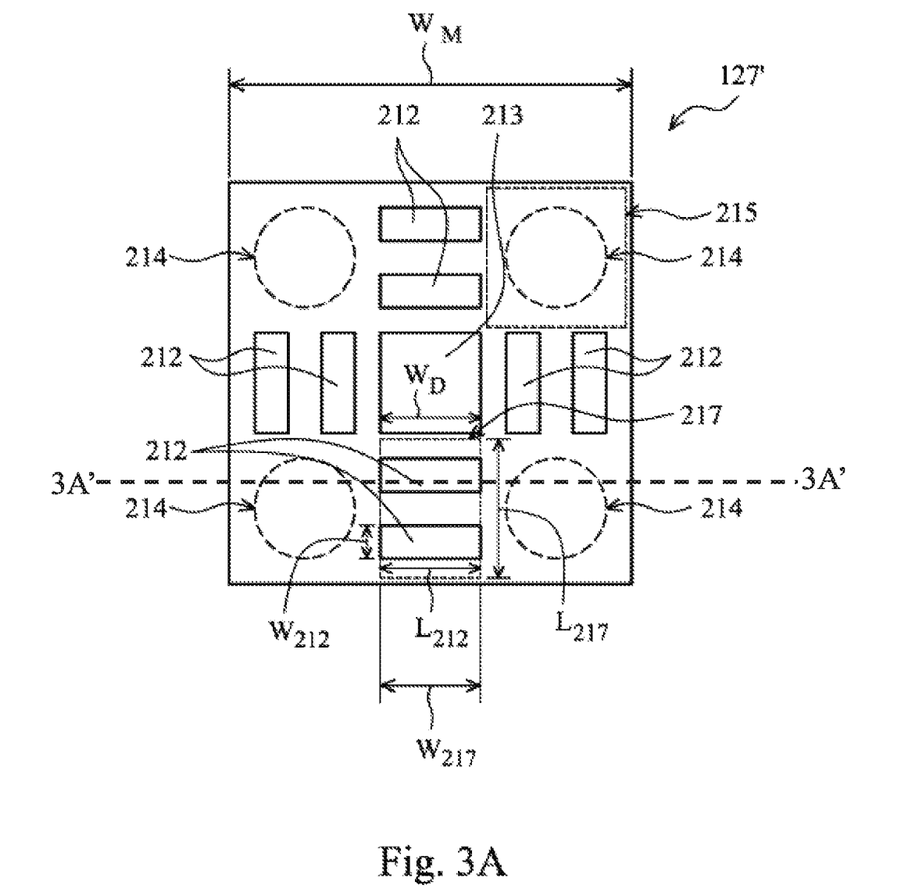
FIG. 3A shows a top view of a metal pad, in accordance with some embodiments.

In order to reduce dishing effect, dielectric structures should be inserted in the metal pads, such as metal pad 127. FIG. 3A shows a metal pad 127' with embedded dielectric structures 212 and 213, in accordance with some embodiments. Dielectric structures 212 and 213 are made of un-etched dielectric stack 204. FIG. 3A shows 4 possible locations 214 (marked by dotted circles) with an underlying TSV 125. As mentioned above, 2 or more TSVs are needed between metal pad 127 and UBM structures 129. For each metal pad 127, two or more of locations 214 are connected to TSVs 125. Locations 214 are placed near corners of metal pad 127', because the corner regions are less susceptible to CMP dishing effect. Regions 215 (marked by dotted lines) surrounding and including locations 214 of metal pad 127' do not include embedded dielectric structures to provide low resistance and good conductivity in connection to TSVs 125.

The center of metal pad 127' is most likely to suffer from dishing effect. As a result, a large dielectric structure 213 is embedded in the center region of metal pad 127'. In some embodiments, the metal pad 127' is shaped as a square with a width $W_M$. Metal pad 127' needs to be large enough to cover TSVs 125 and provide sufficiently low resistance for structures connected to it. In some embodiments, the $W_M$ is in a range from about 30 µm to about 50 µm. The width of dielectric structure 213 is $W_D$. To avoid dishing effect near center of metal pad 127', $W_D$ cannot be too small. In some embodiments, the ratio of $W_D/W_M$ is in a range from about ¼ to about ½. In some embodiments, the $W_D$ is in a range from about 10 µabout 25 µm.

To prevent dishing of the regions 217 between neighboring regions 215, dielectric structures 212 are embedded. FIG. 3A shows two dielectric structures (bars) 212 are formed in each of regions 217. The length $L_{212}$ of each dielectric structure (bar) 212 is about equal to the width $W_D$ of dielectric structure 213 in some embodiments. However, the length $L_{212}$ of dielectric structure 212 could be wider or narrower than the width $W_D$ of dielectric structure 213. The dielectric structures 212 are evenly distributed in regions 217. In some embodiments, the width $W_{212}$ of dielectric structures 212 is in a range from about ⅕ to about ¼ of length $L_{217}$ of region 217. In some embodiments, the $W_{212}$ is in a range from about 2 μm to about 5 μm. FIG. 3A' illustrates a cross-sectional view of metal pad 127' along line 3A'-3A' of FIG. 3A.

Figure 3B:
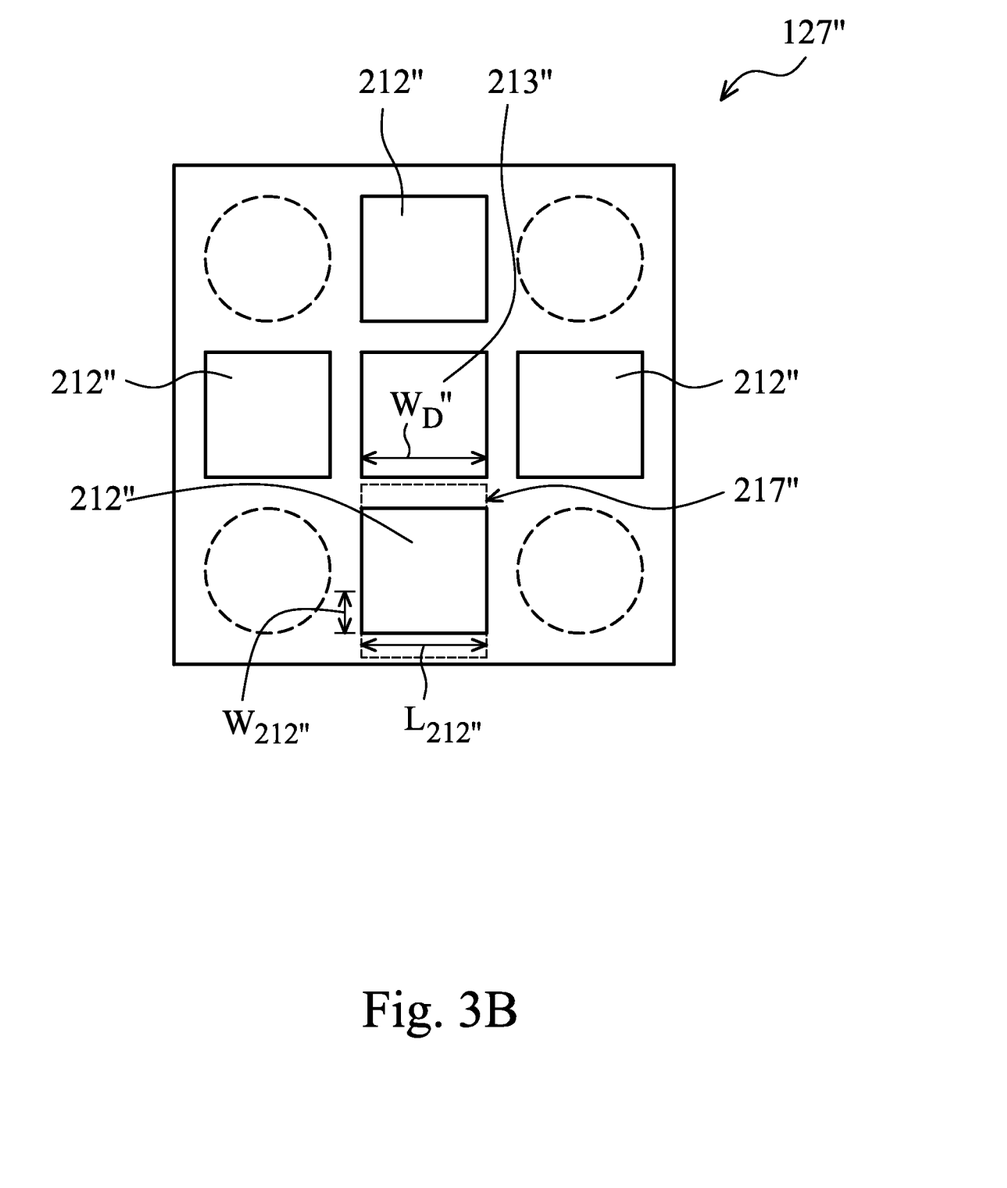
FIG. 3B shows a top view of a metal pad, in accordance with some other embodiments.

The metal pad 127' with embedded dielectric structures 212, 213 described is an embodiment. Other embodiments are also possible. FIG. 3B shows a metal pad 127" in accordance with some other embodiments. Metal pad 127" also includes dielectric structures to reduce CMP dishing effect. The dielectric structures are configured differently from metal pad 127'. Metal pad 127" includes dielectric structures 212" and 213". Dielectric structure 213" is similar to dielectric structure 213. Each region 217" includes one dielectric structure 212", instead of two structures in FIG. 3A. Dielectric structure 212" is wider than dielectric structure 212. In some embodiments, the width $W_{212"}$ of dielectric structures 212" is in a range from about ½ to about ⅔ of length $L_{217"}$ of region 217". In some embodiments, the $W_{212"}$ is in a range from about 2 μm to about 5 μm. The length $L_{212"}$ of each dielectric structure (bar) 212" is about equal to the width $W_{D"}$ of dielectric structure 213" in some embodiments. However, the length $L_{212"}$ of dielectric structure 212" could be wider or narrower than the width $W_{D"}$ of dielectric structure 213".

FIGS. 3A and 3B show one or two dielectric structures in regions 217 and 217" respectively. There could be more than 2 dielectric structures in these regions. In addition, the dielectric structures in these regions could be shaped and arranged differently from what have been described above. Studies show that the embedded dielectric structures described above reduce the dishing effect to non-existent or almost non-existent (see, e.g., FIG. 3A'). As a result, the risk of metal strings between vias is eliminated.

Figure 4A:
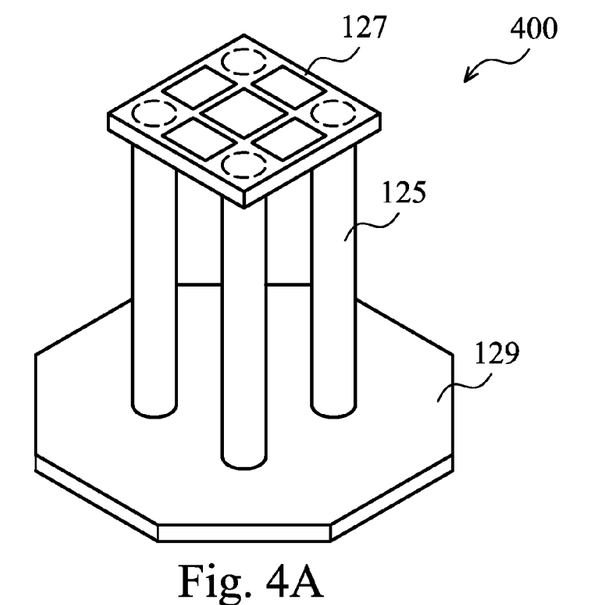
FIG. 4A shows a perspective view of a conductive structure, in accordance with some embodiments.
Figure 4B:
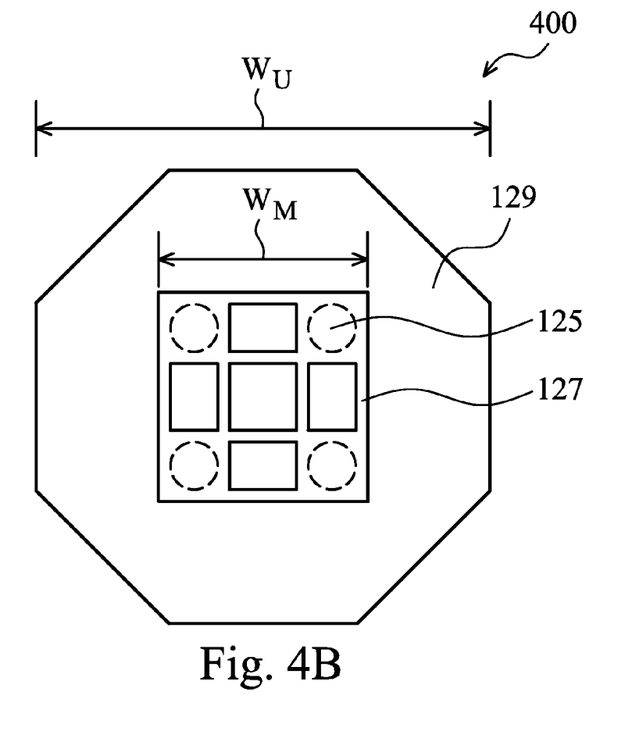
FIG. 4B shows a top view of a conductive structure, in accordance with some embodiments.

FIG. 4A shows a perspective view of a conductive structure 400, in accordance with some embodiments. The conductive structure 400 includes a metal pad 127, four TSVs 125 and a UBM structure 129. As mentioned above, a bump (126), which could be a C4 bump, is connected to UBM structure 129 (not shown). FIG. 4B shows a top view of conductive structure 400, in accordance with some embodiments. Due to the large size of bump 126, the UBM structure 129 is large, in comparison to metal pad 127. FIG. 4B shows that UBM structure 129 has a top view in octagonal shape. The width $W_U$ of UBM structure 129 is in a range from about 80 μm to about 100 μm, in some embodiments. The width $W_U$ of UBM structure 129 is larger than the width $W_M$ of the metal pad 127. The ratio of $W_M$ (width of metal pad) to $W_U$ (width of UBM structure 129 for bump 126) is in a range from about ⅓ to about ½, in some embodiments.

The conductive structure 400 in FIGS. 4A and 4B includes four TSVs 125. As mentioned above, the number of TSVs 125 connecting metal pad 127 and UBM structure 129 for bump 126 should be more than one to ensure good yield. However, the number of TSVs 125 could be 2, 3, or 4, depending on the manufacturing need.

Figure 5:
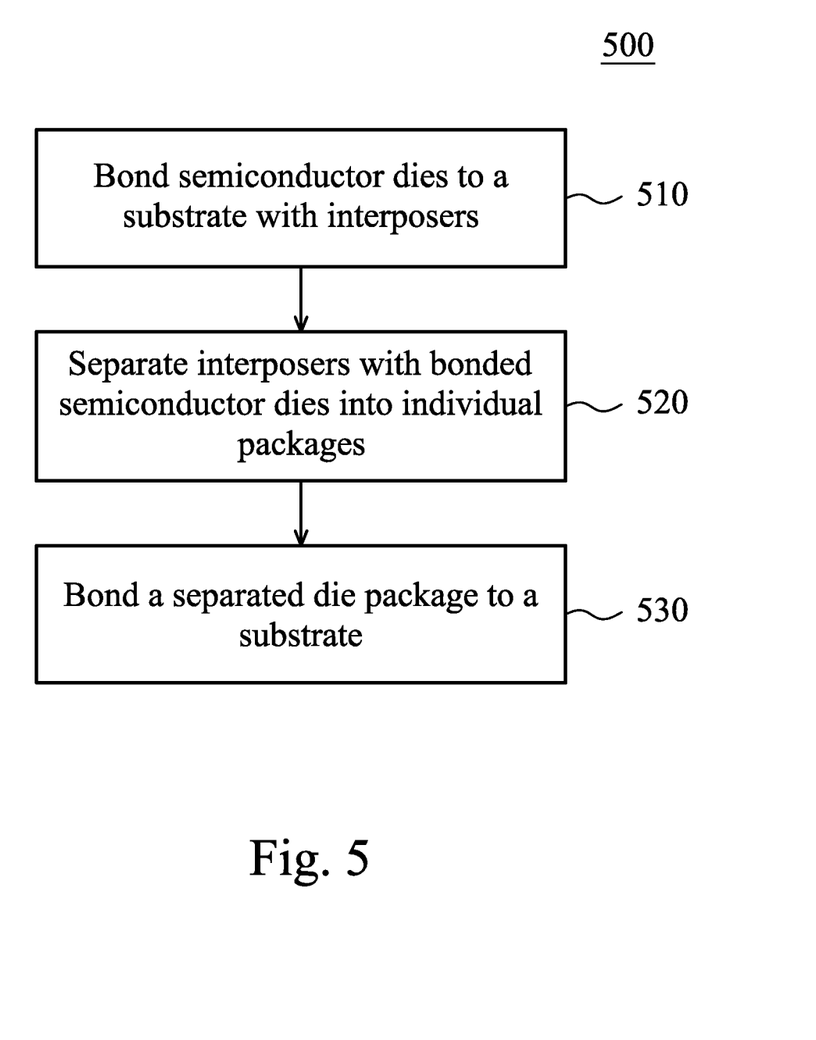
FIG. 5 shows a process flow of forming a 3DIC structure, in accordance with some embodiments.

FIG. 5 shows a process flow of forming a 3DIC structure, in accordance with some embodiments. The process starts after interposers 120' are formed. At operation 510, one or more dies, such as dies $110_A$ and/or $110_B$ are bonded to a substrate with interposers, such as interposers 120'. After dies $110_A$ and/or $110_B$ are bonded to a substrate with interposers 120', underfill 143 is applied to fill the space between dies $110_A$ and/or $110_B$ and interposers 120'. After underfill 143 is formed, molding compound 144 is formed to cover the exposed surfaces of interposers 120' and to fill the space between dies $110_A$ and/or $110_B$. A sawing is then performed to separate interposers with bonded dies into individual die packages at operation 520. Each die package includes dies $110_A$ and/or $110_B$ and interposer 120'. The die package is then bonded to substrate 130' at operation 530. After die package is bonded to substrate 130', underfill 146 is filled between the space between the die package and substrate 130' to form 3DICdie package 100'.

Various embodiments of mechanisms for forming through a three-dimensional integrated circuit (3DIC) structure are provided. The 3DIC structure includes an interposer bonded to a die and a substrate. The interposer has a conductive structure with through silicon vias (TSVs) connected to a patterned metal pad and a conductive structure on opposite ends of the TSVs. The pattern metal pad is embedded with dielectric structures to reduce dishing effect and has regions over TSVs that are free of the dielectric structures. The conductive structure has anf has more TSVs. By using a patterned metal pad and 2 or more TSVs, the reliability and yield of the conductive structure and the 3DIC structure are improved.

In some embodiments, an interposer structure is provided. The interposer structure includes two or more through silicon vias (TSVs), and a patterned metal pad. The two or more TSVs are physically connected to the patterned metal pad, and the patterned metal pad has embedded dielectric structures. The embedded dielectric structures are not over the two or more TSVs. The interposer structure also includes a conductive structure physically connected to the two or more TSVs on an opposite end from the patterned metal pad.

In some other embodiments, a package structure is provided. The package structure includes a semiconductor die, and an interposer structure connected to the semiconductor die. The interposer structure further comprises two or more through silicon vias (TSVs) and a patterned metal pad. The two or more TSVs are physically connected to the patterned metal pad, and the patterned metal pad has embedded dielectric structures. The embedded dielectric structures are not over the two or more TSVs. The package structure also includes a conductive structure physically connected to the two or more TSVs on an opposite end from the patterned metal pad. In addition, the package structure includes a substrate connected to the interposer.

In yet some other embodiments, a method of forming an interposer structure is provided. The method includes forming two or more through silicon vias (TSVs) in a substrate, and forming a patterned metal pad. The two or more TSVs are physically connected to the patterned metal pad, and the patterned metal pad has embedded dielectric structures. The embedded dielectric structures are not over the two or more TSVs. The method also includes grinding a backside of the substrate to expose the two or more TSVs, and forming a conductive structure on the backside of the structure. The conductive structure is physically connected to the two or more TSVs.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An interposer structure, comprising:
a silicon substrate having a first surface and a second surface opposite the first surface;
two or more through silicon vias (TSVs) extending from the first surface of the silicon substrate to the second surface of the silicon substrate;
an interconnect structure comprising conductive interconnect structures and dielectric layers, the conductive interconnect structures comprising metal pads, metal lines, and metal vias, wherein the conductive interconnect structures are insulated by dielectric layers, wherein a bottommost dielectric layer of the dielectric layers is on the first surface of the silicon substrate;
a patterned metal pad in the bottommost dielectric layer of the interconnect structure, the patterned metal pad having a first surface and a second surface opposite the first surface, the first surface of the patterned metal pad extending contiguously a first width between lateral boundaries of the patterned metal pad, wherein the two or more TSVs are physically connected to the first surface of the patterned metal pad, the patterned metal pad having embedded dielectric structures, at least one of the embedded dielectric structures having a third surface and a fourth surface opposite the third surface, wherein:
the embedded dielectric structures are not over the two or more TSVs;
the first surface of the patterned metal pad is substantially level with the third surface of the embedded dielectric structures;
the fourth surface of the embedded dielectric structures is substantially level with the second surface of the patterned metal pad;
the embedded dielectric structures of the patterned metal pad include a first dielectric structure at a center of the patterned metal pad; and
a ratio of a second width of the first dielectric structure to the first width of the patterned metal pad is in a range from about ¼ to about ½; and
a conductive structure on the second surface of the silicon substrate, a first surface of the conductive structure physically connected to the two or more TSVs on an opposite end from the patterned metal pad.

2. The interposer structure of claim 1, wherein the patterned metal pad includes a plurality of regions free of the embedded dielectric structures, wherein the plurality of regions free of the embedded dielectric structures are over respective TSVs.

3. The interposer structure of claim 2, wherein the plurality of regions free of the embedded dielectric structures are at respective corners of the patterned metal pad.

4. The interposer structure of claim 2, wherein the patterned metal pad is shaped in a square and the plurality of regions free of the embedded dielectric structures include four regions located at respective corners of the patterned metal pad.

5. The interposer structure of claim 2, wherein the embedded dielectric structures include a second dielectric structure located between two neighboring regions of the plurality of regions free of the embedded dielectric structures.

6. The interposer structure of claim 2, wherein the embedded dielectric structures include more than one second dielectric structure located between neighboring regions of the plurality of regions free of the embedded dielectric structures.

7. The interposer structure of claim 2, wherein the embedded dielectric structures of the patterned metal pad include a first dielectric structure at a center of the patterned metal pad, and include more than one dielectric structure located between neighboring regions of the plurality of regions free of the embedded dielectric structures.

8. The interposer structure of claim 1, wherein the conductive structure is an under bump metallurgy (UBM) structure.

9. A package structure, comprising:
a semiconductor die;
an interposer structure connected to the semiconductor die, further comprising:
two or more through silicon vias (TSVs);
a patterned metal pad, wherein the two or more TSVs are physically connected to the patterned metal pad, wherein the patterned metal pad has embedded dielectric structures, wherein the embedded dielectric structures are not over the two or more TSVs, wherein opposing major surfaces of the embedded dielectric structures are substantially level with opposing major surfaces of the patterned metal pad, wherein the embedded dielectric structures of the patterned metal pad include a first dielectric structure at a center of the patterned metal pad, and wherein a ratio of a width of the first dielectric structure to a width of the patterned metal pad is in a range from about ¼ to about ½; and
a conductive structure having a first surface extending contiguously a width between lateral boundaries of the conductive structure, the width of the conductive structure greater than the width of the patterned metal pad, the first surface of the conductive structure physically connected to the two or more TSVs on an opposite end from the patterned metal pad; and
a substrate connected to the interposer structure.

10. The package structure of claim 9, wherein the patterned metal pad includes a plurality of regions free of the embedded dielectric structures, wherein the plurality of regions free of the embedded dielectric structures are over respective TSVs.

11. The package structure of claim 10, wherein the plurality of regions free of the embedded dielectric structures are at respective corners of the patterned metal pad.

12. The interposer structure of claim 10, wherein the embedded dielectric structures of the patterned metal pad include a first dielectric structure at a center of the patterned metal pad, and more than one dielectric structure located between neighboring regions of the plurality of regions free of the embedded dielectric structures.

13. A package structure, comprising:
a semiconductor die; and
an interposer structure connected to the semiconductor die by an interconnect structure, the interposer structure further comprising:
a plurality of through vias (TVs) extending from a first side of the interposer structure to a second side of the interposer structure opposite the first side;
a metal pad on the first side of the interposer structure, the plurality of TVs in contact with the metal pad;
a plurality of dielectric structures embedded in the metal pad, wherein the plurality of dielectric structures do not overlie any one of the plurality of TVs, the plurality of dielectric structures comprises a first dielectric structure in a center of the metal pad, a ratio of a width of the first dielectric structure to a width of the metal pad is in a range from about ¼ to about ½, the plurality of dielectric structures formed from a dielectric stack layer, the dielectric stack layer having opposing surfaces that are substantially level with opposing surfaces of the metal pad; and
a conductive structure on the second side of the interposer structure, the conductive structure having a first surface extending contiguously a width between lateral boundaries of the conductive structure, the width of the conductive structure greater than the width of the metal pad, the first surface of the conductive structure in contact with the plurality of TVs.

14. The package structure of claim 13, wherein the interconnect structure comprises conductive interconnect structures comprising conductive pads, conductive lines, and conductive vias, and wherein the conductive interconnect structures are insulated by dielectric layers.

15. The package structure of claim 13, wherein the interconnect structure is connected to the semiconductor die with a plurality of μ bumps.

16. The package structure of claim 13, wherein the plurality of dielectric structures comprises a plurality of second dielectric structures in perimeter regions of the metal pad.

17. The package structure of claim 16, wherein the metal pad comprises a square shape in a top down view, the plurality of dielectric structures are not in at least two corner regions of the metal pad, and the plurality of TVs contact the metal pad in the at least two corner regions of the metal pad.

18. The package structure of claim 17, wherein:
the first dielectric structure comprises a first width;
at least two of the plurality of second dielectric structures in the perimeter region between the at least two corner regions of the metal pad each comprise a length and a second width;
the first width and the length are about equal; and
the second width is from about ⅕ to about ¼ of the length.

19. The interposer structure of claim 1, wherein the first surface of the conductive structure extends continguously a third width between lateral boundaries of the conductive structure, the third width of the conductive structure being greater than the first width of the patterned metal pad.

20. The interposer structure of claim 19, wherein a ratio of a width of the patterned metal pad to the third width of the conductive structure is in a range from about ⅓ to about ½.

* * * * *

UNITED STATES PATENT AND TRADEMARK OFFICE
CERTIFICATE OF CORRECTION

PATENT NO. : 9,978,637 B2
APPLICATION NO. : 14/052365
DATED : May 22, 2018
INVENTOR(S) : Liu et al.

Page 1 of 1

It is certified that error appears in the above-identified patent and that said Letters Patent is hereby corrected as shown below:

In Column 12, Line 26, Claim 19, delete "continguously" and insert --contiguously--.

Signed and Sealed this
Thirty-first Day of July, 2018

Andrei Iancu
*Director of the United States Patent and Trademark Office*